United States Patent [19]
Nishimura

[11] Patent Number: 6,144,578
[45] Date of Patent: Nov. 7, 2000

[54] FERROELECTRIC MEMORY DEVICE AND A METHOD FOR MANUFACTURING THEREOF

[75] Inventor: Kiyoshi Nishimura, Kyoto, Japan

[73] Assignee: Rohm Co., Ltd., Kyoto, Japan

[ * ] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/971,915

[22] Filed: Nov. 17, 1997

[30] Foreign Application Priority Data

Nov. 19, 1996 [JP] Japan .................................. 8-307949

[51] Int. Cl.⁷ .................................................. G11C 11/22
[52] U.S. Cl. ...................................... 365/145; 365/189.07
[58] Field of Search ........................ 365/145, 65, 189.09, 365/189.07, 117

[56] References Cited

U.S. PATENT DOCUMENTS

| | | | |
|---|---|---|---|
| 5,572,459 | 11/1996 | Wilson et al. | 365/145 |
| 5,579,257 | 11/1996 | Tai | 365/145 |
| 5,621,680 | 4/1997 | Newman et al. | 365/145 |
| 5,721,699 | 2/1998 | DeVilbiss | 365/145 |
| 5,724,283 | 3/1998 | Tai | 365/145 |
| 5,737,260 | 4/1998 | Takata et al. | 365/145 |
| 5,764,561 | 6/1998 | Nishimura | 365/145 |

*Primary Examiner*—Amir Zarabian
*Attorney, Agent, or Firm*—Merchant & Gould P.C.

[57] ABSTRACT

It is an object of the present invention to provide a ferroelectric memory device including a load capacitor corresponding to an actual read-out time period appropriately and capable of reading out stored data in a high-speed as well as saving electric power consumption. An applying duration "t" (=2.5n seconds) which generates the maximum value of the differential voltage ΔV of approximately 0.87V is selected when a voltage value corresponding the minimum detectable value of the sense amplifier AMP1 is 0.8V. Also, capacitance C of the load capacitor Cb is determined at the capacitance (≈1.25 pF) which maximize the differential voltage ΔV when the applying duration "t" is 2.5n seconds. Another applying duration "tp" (not shown) of read-out voltage Vp is set as 2.5n seconds the same as the applying duration of the voltage Vd for determining characteristics of a capacitor. A duration required for rewrite operation can be shorten when the applying duration "tp" of read-out voltage Vp is set shorter. In this way, a duration required from read-out operation to rewrite operation can be shorten as well as saving electric power consumption.

20 Claims, 11 Drawing Sheets

(PRIOR ART)

FERROELECTRIC MEMORY DEVICE AND A METHOD FOR MANUFACTURING THEREOF

CROSS-REFERENCE TO RELATED APPLICATION

The entire disclosure of Japanese Patent Application No. Hei 8-307949 filed on Nov. 19, 1996 including specification, claims, drawings and summary are incorporated herein by reference in its entirety.

BACKGROUND OF INVENTION

1. Field of the Invention

This invention relates to a ferroelectric memory device, more specifically a ferroelectric memory device capable of reading out stored data in a high-speed as well as saving electric power consumption.

2. Description of the Related Art

A ferroelectric memory device using a ferroelectric capacitor is known as an nonvolatile type semiconductor memory. A circuit diagram of a part of the ferroelectric memory is shown in FIG. 8. The ferroelectric memory comprises a ferroelectric capacitor 4 for memory (hereinafter referred to as memory ferroelectric capacitor 4) and a load capacitor 6. A hysteresis curve illustrated in FIG. 9 shows a relationship between voltages applied to the memory ferroelectric capacitor 4 (an electric potential at a bit line BL when an electric potential detected at a plate line PL is used as a reference potential) and polarization state (in the drawing, "polarization state" is illustrated as "electric charge" which is equivalent to the polarization state).

It is assumed that a state which causes remanent polarization Z1 is referred to as first polarization state P1 (equivalent to stored data "High" in the memory ferroelectric capacitor 4), and a state which causes remanent polarization Z2 is referred to as second polarization state P2 (equivalent to stored data "low" therein). Storing data in the memory ferroelectric capacitor 4 can be read out by detecting polarization state thereof.

In order to detect polarization state of the memory ferroelectric capacitor 4, a divided voltage Vf generated between both ends of the memory ferroelectric capacitor 4 is measured when a read-out voltage Vp is applied to the plate line PL after making the bit line BL to floating state upon discharging the load capacitor 6 shown in FIG. 8.

According to a pictorial solution method shown in FIG. 9, the divided voltage Vf generated between both ends of the memory ferroelectric capacitor 4 becomes V1 when the memory ferroelectric capacitor 4 is in the first polarization state P1, and the divided voltage Vf becomes V2 when the capacitor 4 is in the second polarization state P2, in case of illustrating a capacitance of the load capacitor 6 with a gradient of a line L1. So that, polarization state of the memory ferroelectric capacitor 4 can be detected whether it is in the first polarization state P1 or in the second polarization state P2 by comparing the divided voltage Vf generated between both ends of the memory ferroelectric capacitor 4 during read-out operation and the reference voltage Vref in case of setting the reference voltage Vref as shown in FIG. 9.

It is preferred to have a larger difference in voltage between a voltage V1 and a voltage V2, because larger margin of detection can be obtained when the voltage difference becomes larger. Voltage difference ΔV between the voltage V1 and the voltage V2 varies depending on voltage/charge characteristics of the memory ferroelectric capacitor 4 and voltage/charge characteristics of the load capacitor 6. FIG. 10 shows a graph illustrating a relationship between the capacitance (voltage/charge characteristics) of the load capacitor 6 and the voltage difference ΔV when voltage/charge characteristics of the memory ferroelectric capacitor 4 is fixed to a certain value.

In the conventional ferroelectric memory device, a capacitance C0 (C0≈5 pF in FIG. 10) of the load capacitor 6 is set so as to maximize the voltage difference ΔV. To do that, larger margin of detection can be obtained.

However, the conventional ferroelectric memory device described in above has following problems to be resolved. The relationship illustrated in FIG. 10 is plotted based on a condition of applying a read-out voltage Vp to the plate line PL for infinite time. So that, the capacitance C0 of the load capacitor 6 is set in accordance with the condition.

Although, the condition shown in FIG. 10 is set as infinite time period, actual time period for applying the read-out voltage Vp has a definite period of time period. It is uncertain whether or not the capacitance C0 being set as described in above can provide the maximum value of the voltage difference ΔV against an actual read-out time period.

Also, the shorter period of application of the read out-voltage Vp, the less voltage difference ΔV is made. So that, detection of stored data can be done easily when the read-out voltage Vp is applied for relatively longer time period because larger voltage difference ΔV is maintained. On the contrary, there is slight difficulties in detection of stored data when the read-out voltage Vp is applied for shorter time period because less voltage difference ΔV is maintained. As a result, read-out operation of the conventional ferroelectric memory device can not be done in a high-speed. Further, a larger amount of electric power consumption is required (see FIG. 11, electric power consumption of the device will be described later)

SUMMARY OF THE INVENTION

It is an object of the present invention to provide a ferroelectric memory device comprising a load capacitor comprising to an actual read-out time period appropriately and capable of reading out stored data in a high-speed as well as saving electric power consumption.

In accordance with characteristics of the present invention, a ferroelectric memory device comprises:

a memory ferroelectric capacitor capable of storing a first polarization state corresponding a first storing data or a second polarization state corresponding a second storing data, a load capacitor capable of being connected to the memory ferroelectric capacitor in series, and a storing data detection means for detecting the storing data in accordance with a divided voltage generated at the memory ferroelectric capacitor when a predetermined read-out voltage is applied to both the memory ferroelectric capacitor and the load capacitor both of which are connected each other in series, wherein voltage/charge characteristics of the load capacitor is set so as to maximize a voltage difference between the divided voltage at the first polarization state and the divided voltage at the second polarization state when a voltage for determining characteristics of a capacitor equivalent to the read-out voltage is applied for a predetermined definite time period to the memory ferroelectric capacitor and the load capacitor both of which are connected in series.

Also, in accordance with characteristics of the present invention, a ferroelectric memory device comprises:

a memory ferroelectric capacitor capable of storing a first polarization state corresponding a first storing data or a second polarization state corresponding a second storing data, a load capacitor capable of being connected to the memory ferroelectric capacitor in series, and a storing data detection means for detecting the storing data in accordance with a divided voltage generated at the memory ferroelectric capacitor when a predetermined read-out voltage is applied to both the memory ferroelectric capacitor and the load capacitor both of which are connected each other in series, wherein voltage/charge characteristics of the load capacitor is set in correspondence to a duration of applying the read-out voltage.

Further, in accordance with characteristics of the present invention, a method for manufacturing a ferroelectric memory device comprising a memory ferroelectric capacitor capable of storing a first polarization state corresponding a first storing data or a second polarization state corresponding a second storing data, a load capacitor capable of being connected to the memory ferroelectric capacitor in series and a storing data detection means for detecting the storing data in accordance with a divided voltage generated at the memory ferroelectric capacitor when a predetermined read-out voltage is applied to both the memory ferroelectric capacitor and the load capacitor both of which are connected each other in series comprises step of:

setting voltage/charge characteristics of the load capacitor so as to maximize a voltage difference between the divided voltage at the first polarization state and the divided voltage at the second polarization state when a voltage for determining characteristics of a capacitor equivalent to the read-out voltage is applied for a predetermined definite time period to the memory ferroelectric capacitor and the load capacitor both of which are connected in series.

While the novel features of the invention are set forth in a general fashion, both as to organization and content, it will be better understood and appreciated, along with other objections and features thereof, from the following detailed description taken in conjunction with the drawings.

DETAILED DESCRIPTION OF THE PREFERRED EMBODIMENT

Figure 2:
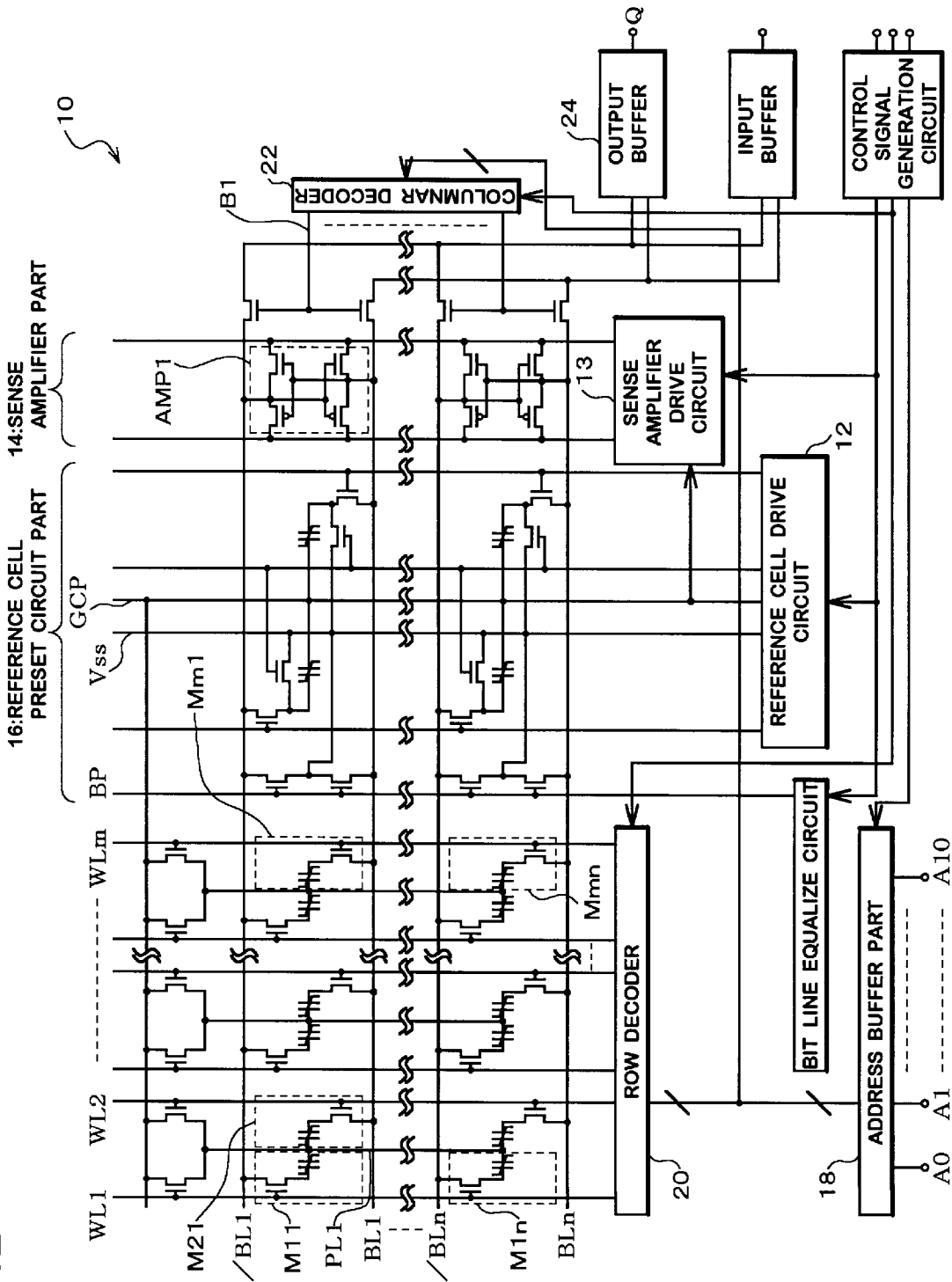
FIG. 2 is a partial circuit diagram of the ferroelectric memory device 10.

FIG. 2 is a partial circuit diagram of the ferroelectric memory device 10 using a ferroelectric capacitor as an embodiment of a ferroelectric memory device of the present invention. The ferroelectric memory device 10 has a matrix structure composed of a plurality of memory cells such as memory cell M11, M21 . . . Mmn. A series of memory cell M11 . . . M1n (memory cells extended to longitudinal direction) is referred to as row, and another series of memory cell M11 . . . Mm1 (memory cells extended to lateral direction) is referred to as column in FIG. 2.

Further, the ferroelectric memory device 10 comprises a reference cell drive circuit 12, a sense amplifier part 14 having a sense amplifier AMP1 . . . and a reference cell preset circuit part 16. A read-out voltage is applied to a plate line PL1 through a global cell late line (hereinafter referred to as "line GCP") by the reference cell drive circuit 12. The sense amplifier part 14 and the reference cell preset circuit part 16 both of which correspond to stored data detection means. Further, rewrite operation being described later is done by the reference cell drive circuit 12 and the sense amplifier part 14.

In this embodiment, the reference cell drive circuit 12 is used both for application of a read-out voltage and the rewrite operation, and the sense amplifier part 14 is used both for detection of stored data and the rewrite operation. Thus, circuit configuration of the ferroelectric memory device 10 can be simplified.

Figure 3:
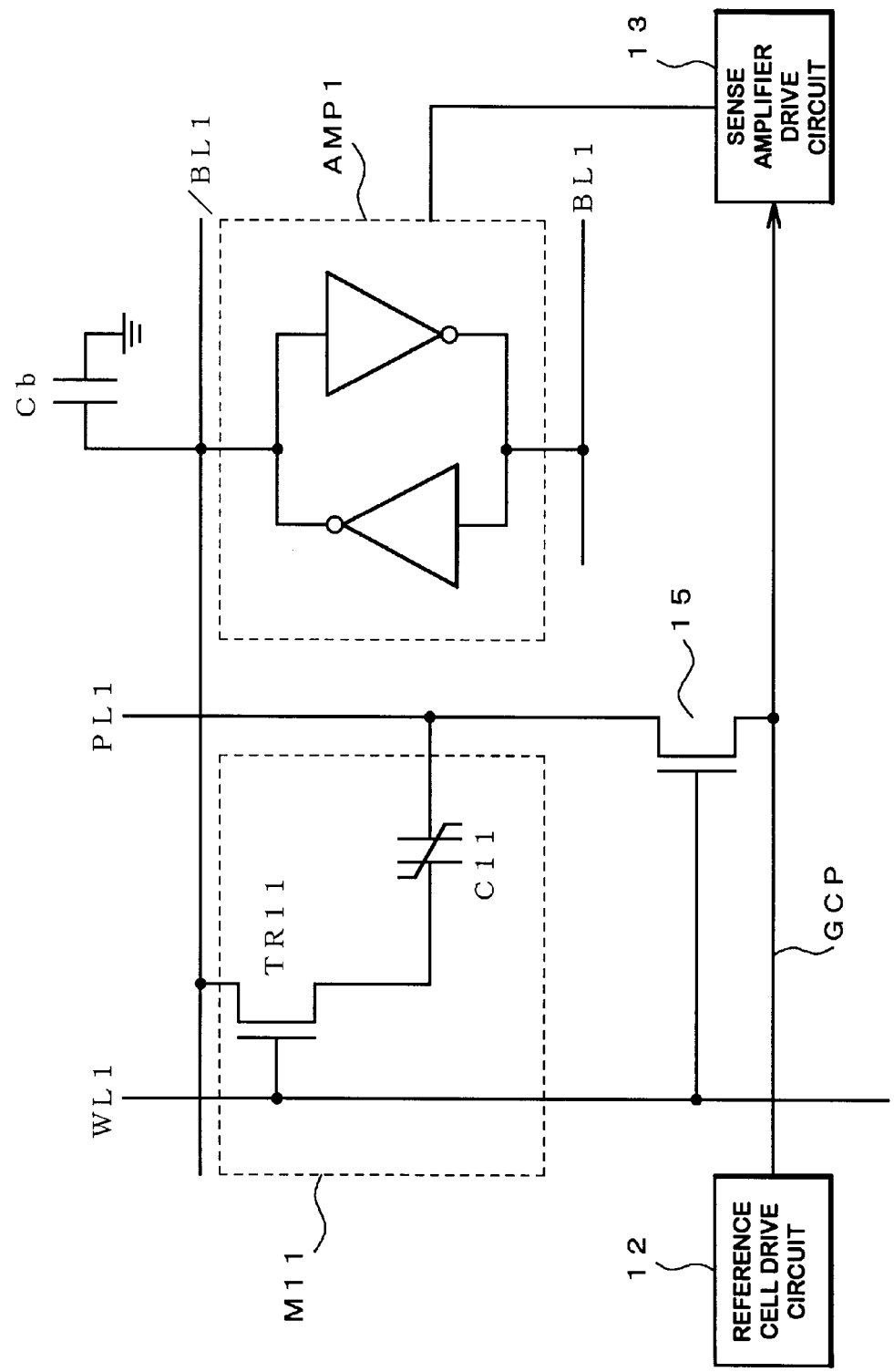
FIG. 3 is an enlarged circuit diagram illustrating vicinity of a memory cell in the ferroelectric memory device 10.

FIG. 3 is an enlarged circuit diagram illustrating vicinity of a memory cell M11 in the ferroelectric memory device 10. The memory cell M11 comprises a memory ferroelectric capacitor C11 and a selecting transistor TR11. One end of the memory ferroelectric capacitor C11 is connected electrically to a load capacitor Cb in series through the selecting transistor TR11 and a bit line/BL1. In this embodiment, the load capacitor Cb is a permanent dielectric capacitor being provided as a parasitic capacitor between the bit line/BL1 and the ground.

The other end of the memory ferroelectric capacitor C11 is connected to the reference cell drive circuit 12 through the plate line PL1, a transistor 15 and the line GCP.

Gates of both the selecting transistor TR11 and the transistor 15 are connected to a word line WL1. One end of the sense amplifier AMP1 is connected to the bit line/BL1, and the other end of the sense amplifier AMPI is connected to the reference cell preset circuit part 16 (see FIG. 2) through the bit line BL1.

The sense amplifier AMP1 is driven by a sense amplifier drive circuit 13. The sense amplifier drive circuit 13 detects a rise of a signal being transferred on the line GCP, and the circuit 13 drives the sense amplifier AMP1 after detecting the signal in a certain period of time.

Figure 1:
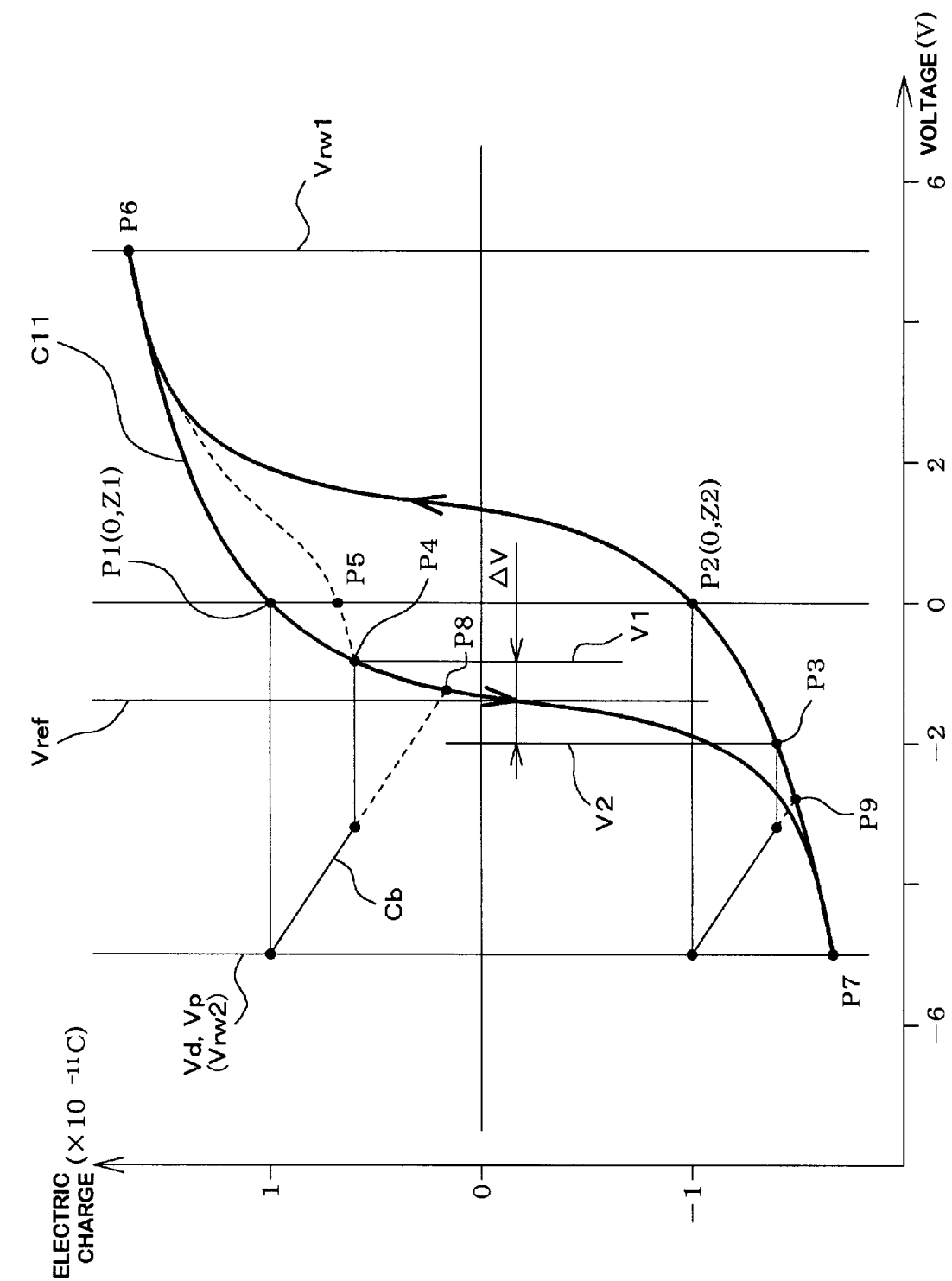
FIG. 1 is a graph for describing operation of a memory ferroelectric capacitor C11 used for a ferroelectric memory device 10 as an embodiment of the present invention.

FIG. 1 shows a hysteresis curve illustrating a relationship between voltages applied to the memory ferroelectric capacitor C11 (an electric potential at the bit line/BL1 when an electric potential detected at the plate line PL1 is used as a reference potential) and polarization state (in the drawing, "polarization state" is illustrated as "electric charge" which is equivalent to the polarization state). It is assumed that a state which causes remanent polarization Z1 is referred to as first polarization state P1 (equivalent to stored data "High" in the memory ferroelectric capacitor C11), and a states which causes remanent polarization Z2 is referred to as second polarization state P2 (equivalent to stored data "Low" therein). Capacitance of the load capacitor Cb and duration Tp of applying a read-out voltage Vp shown in FIG. 3 are determined as follows.

It is assumed that a difference between a divided voltage Vf generated during the first polarization state and another divided voltage Vf generated during the second polarization is referred to as a differential voltage ΔV. The divided voltage Vf generated during the first polarization state or the second polarization state is caused at the memory ferroelectric capacitor C11 when a voltage Vd for determining characteristics of a capacitor equivalent to the read-out voltage Vp is applied to the memory ferroelectric capacitor C11 and the load capacitor Cb C11 for time period "t" (having a predetermined definite time period) both of which being connected in series.

Figure 4:
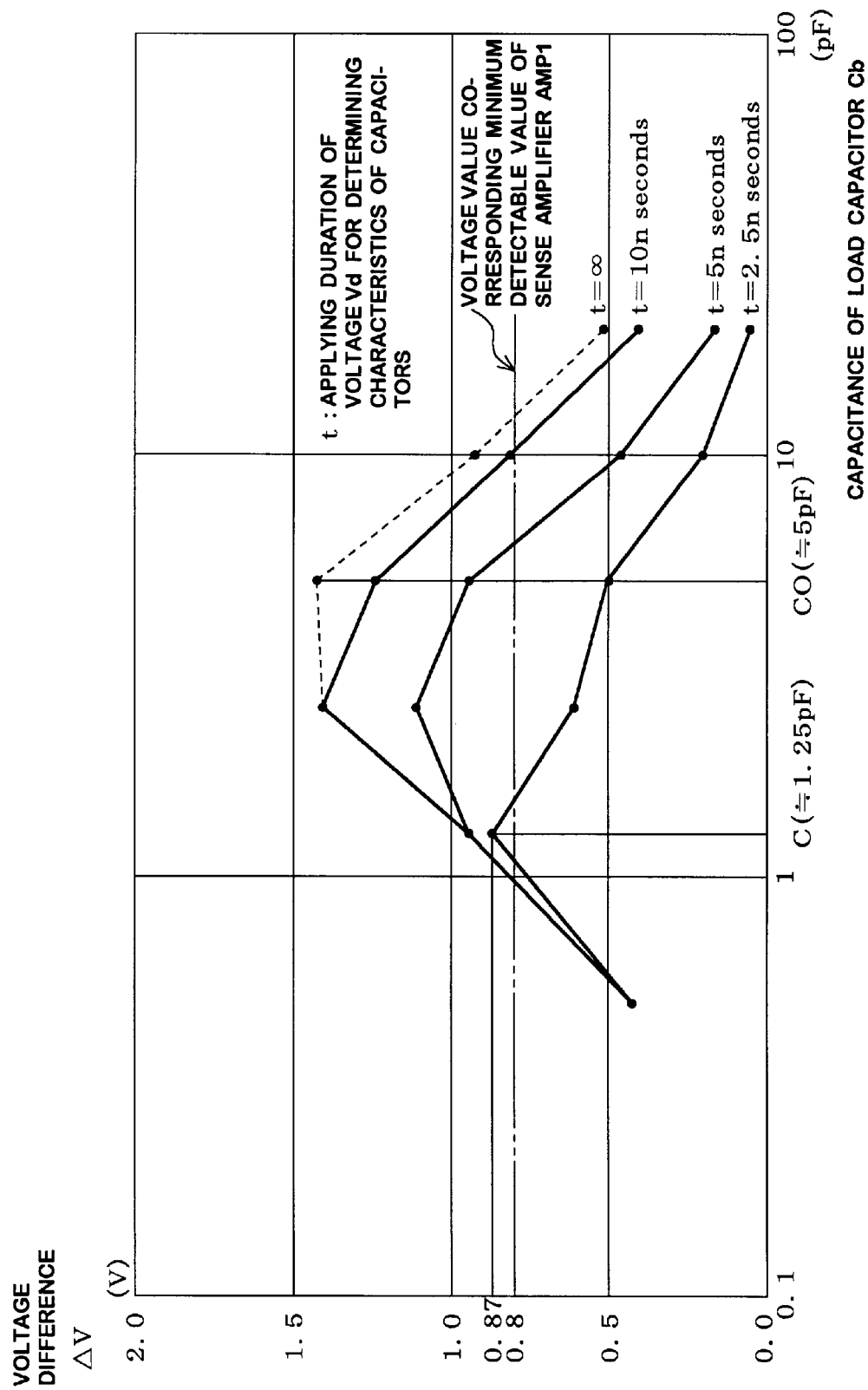
FIG. 4 is a graph showing a relationship between a capacitance of a load capacitor Cb and a voltage difference ΔV when voltage/charge characteristics of the memory ferroelectric capacitor C11 is fixed to a certain value using a time period "t" as a parameter.

FIG. 4 shows a relationship between capacitance of the load capacitor Cb and a differential voltage ΔV when voltage/charge characteristics of the memory ferroelectric capacitor C11 is fixed to a certain value using a time period "t" (hereinafter referred to as applying duration) as a parameter.

Next, an applying duration "t" is selected so as to make the maximum value of the voltage difference almost equal to a voltage corresponding to the minimum detectable value of the sense amplifier AMP1. In the applying duration "t" thus selected, a capacitance which maximize the differential voltage ΔV is set as the capacitance of the load capacitor Cb.

For instance, an applying duration "t" (=2.5n seconds) which generates the maximum value of the differential voltage ΔV approximately 0.87V is selected as shown in FIG. 4 when a voltage value corresponding the minimum detectable value of the sense amplifier AMP1 is 0.8V. Also, the capacitance C of the load capacitor Cb is set at the capacitance (≈1.25 pF) which maximize the differential voltage ΔV when the applying duration "t" is 2.5n seconds.

Figure 5:
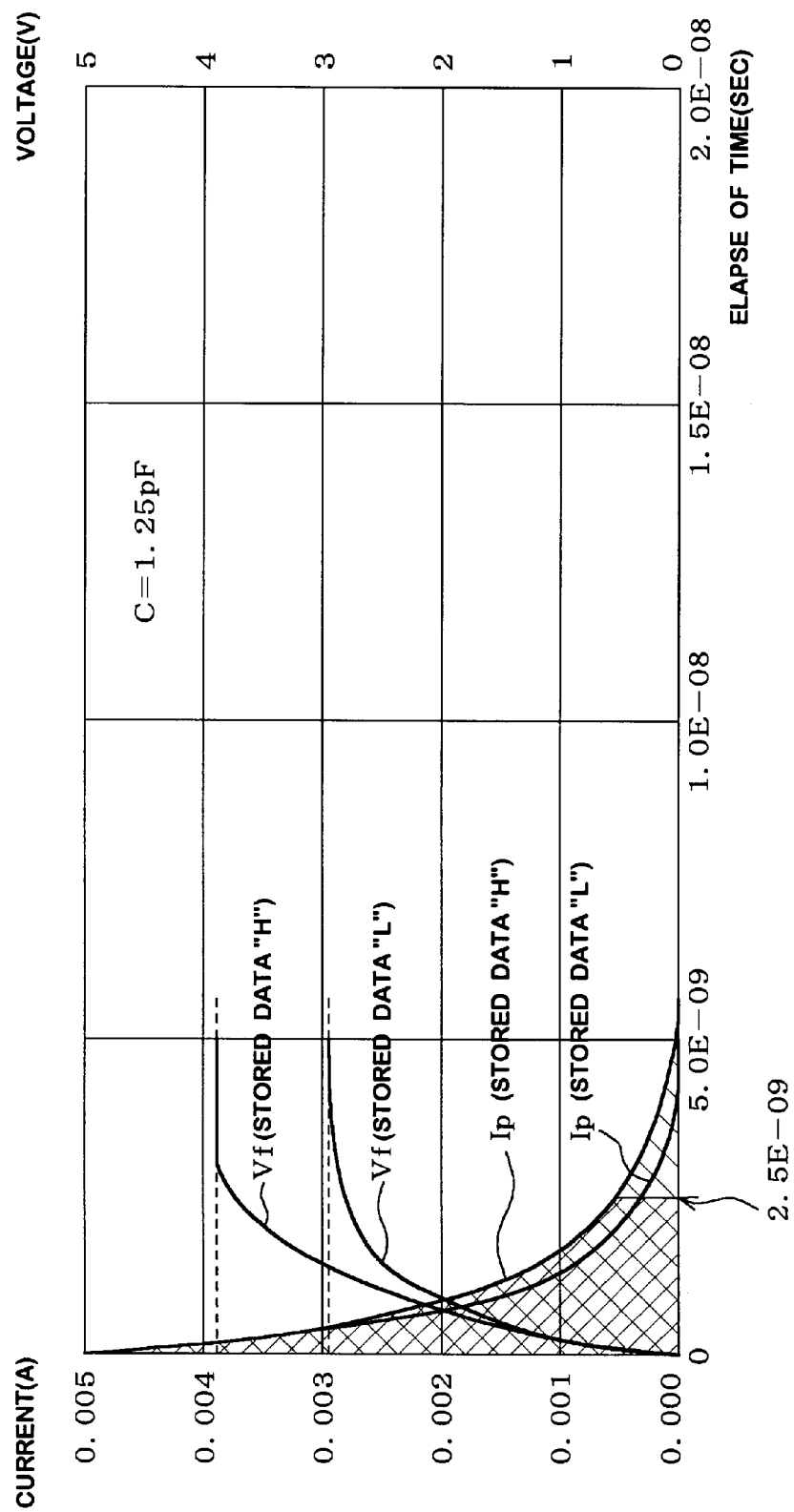
FIG. 5 is a graph showing a variation of both a current Ip being flown on a plate line PL1 and a divided voltage Vf generated at the memory ferroelectric capacitor C11 with elapse of time during read-out operation in the ferroelectric memory device 10.
Figure 11:
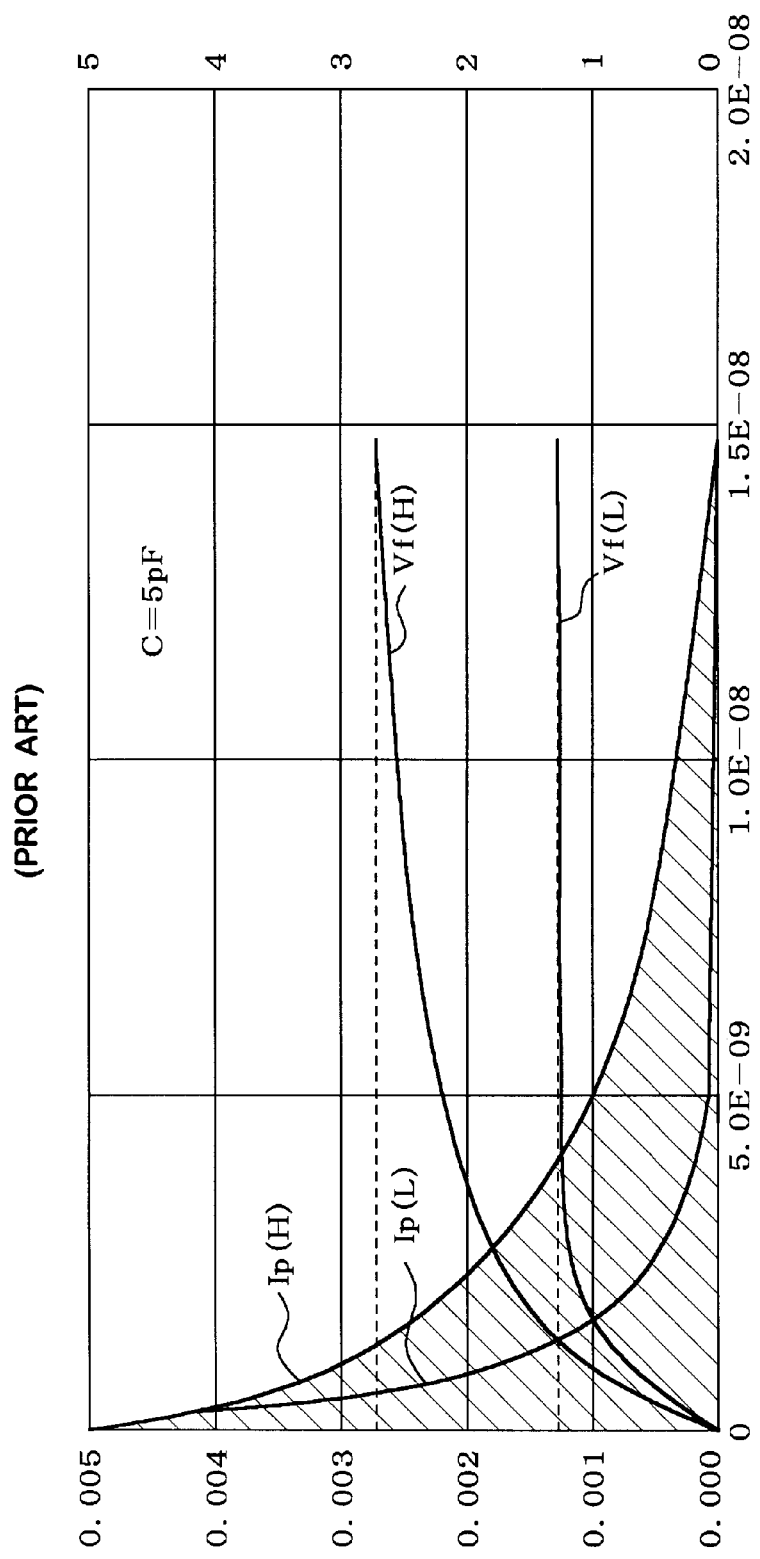
FIG. 11 is a graph for describing electric power consumption of the conventional ferroelectric memory device during read-out operation.

FIG. 5 shows a variation of both a current Ip being flown on the plate line PL1 and a divided voltage Vf generated at the memory ferroelectric capacitor C11 with elapse of time during the read-out operation when the load capacitor Cb thus set (capacitance ≈1.25 pF) is used. Also, FIG. 11 is a graph illustrating a variation of both a current Ip and a divided voltage Vf when the capacitance of the load capacitor Cb (capacitance ≈5 pF) being set with a conventional method is used. By comparing the variation shown in FIG. 5 and that of shown in FIG. 11, time integral value (hatched area) of the current Ip shown in FIG. 5 is much less than that of shown in FIG. 11 when stored data of the is "High" in the memory ferroelectric capacitor C11.

Also, an applying duration "tp" of read-out voltage Vp (namely read-out duration) is set at 2.5n seconds the same as the applying duration of the voltage Vd for determining characteristics of a capacitor in this embodiment. By setting the applying duration "tp" of read-out voltage Vp at 2.5n seconds, time integral value (area in lattice) of the current Ip shown in FIG. 5 is further decreased.

Further, a duration required for rewrite operation can be shorten by decreasing the applying duration "tp" of the read-out voltage Vp as describe in later. In this way, a duration required from read-out operation to rewrite operation can be shorten. Further, electric power consumed during the duration can be decreased than that of consumed during the conventional method by shorten the duration required for the rewrite operation.

In this embodiment, the voltage corresponding the minimum detectable value of the sense amplifier AMP1 such as 0.8V includes both tolerance occurred at manufacturing processes and margin obtained at the detection.

Although, the sense amplifier drive circuit 13 detects a rise of a signal being transferred on the line GCP, and the circuit 13 drives the sense amplifier AMP1 after detecting the signal in a certain period of time, the period of the time is set to the applying duration "tp" of read-out voltage Vp in this embodiment.

Although, detection of the differential voltage ΔV can be done correctly when the read-out voltage is applied for 5n seconds to the selected load capacitance having a capacitance C0 ≈5 pF (which is set under the conventional method shown in FIG. 4), incorrect detection is done when the read-out voltage is applied for 2.5n seconds to the selected load capacitances. Because detected value of the differential voltage ΔV such as approximately 0.5V shown in FIG. 4 is lower than the minimum detectable value (0.8V) of the sense amplifier AMP1 when the read-out voltage is applied for 2.5n seconds.

Next, read-out operation of stored data in the ferroelectric memory device 10 is done as described hereunder. Desired address is inputted to an address buffer 18 shown in FIG. 2 when stored data of the memory cell M11 is read out. By inputting the address, the memory cell M11 is selected through a row decoder 20 by selecting cells located at longitudinal direction and a columnar decoder 22 by selecting cells located at lateral direction.

Figure 6:
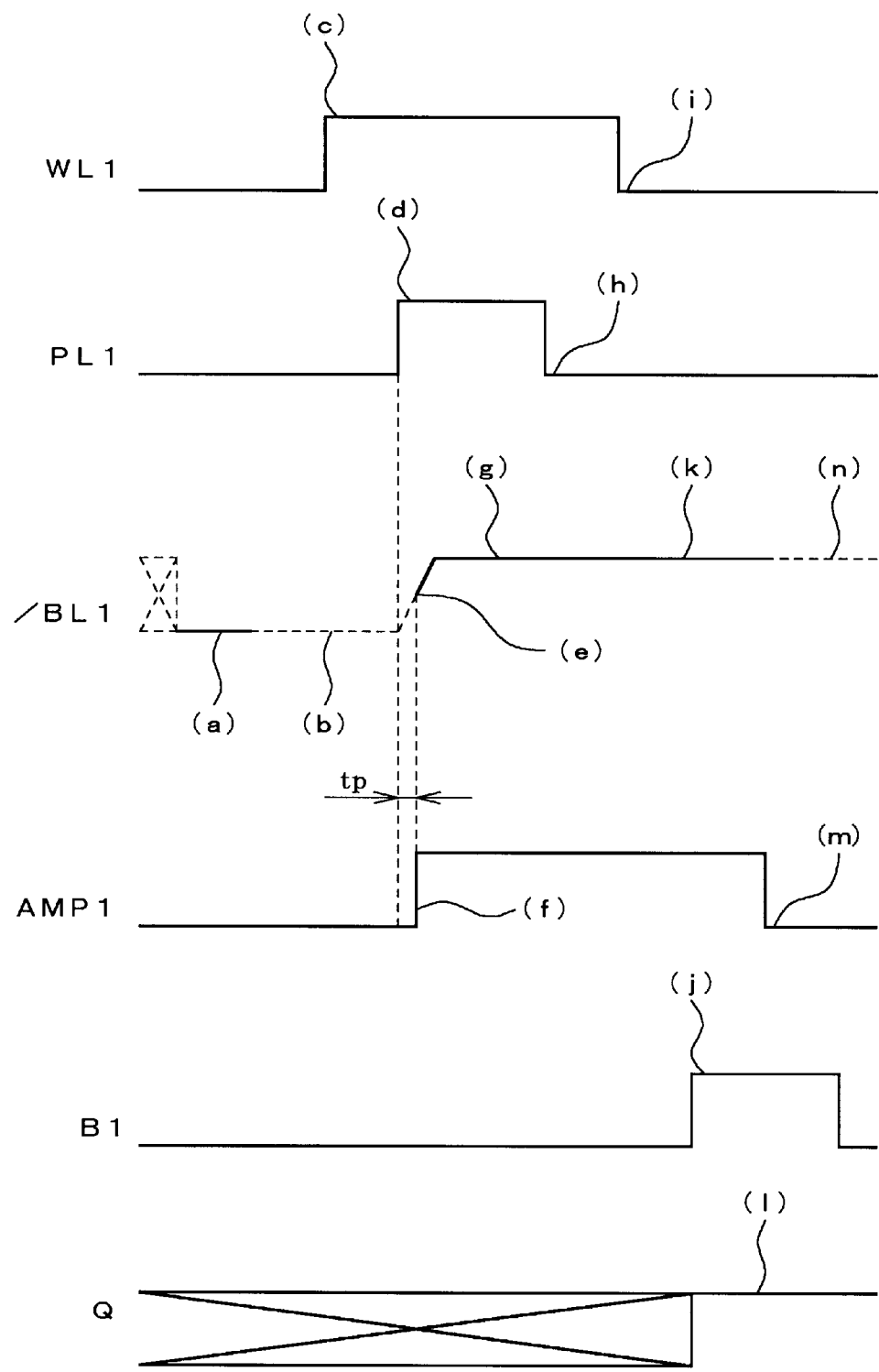
FIG. 6 is a timing chart for describing readout procedure of data "High" in the ferroelectric memory device 10.

FIG. 6 is a timing chart for describing readout procedure of data "High" in the ferroelectric memory device 10. Read out operation of data "High" is described in accordance with FIG. 1 and FIG. 3 with reference to FIG. 6 and FIG. 2.

The load capacitor Cb is discharged by turning the bit line/BL1 shown in FIG. 3 to "low state" (see FIG. 6(a)). Thereafter, the bit line/BL1 is turned into "floating state" (see FIG. 6(b)).

Then, both the selecting transistor TR11 and the transistor 15 are turned to "ON state" by turning the word line WL1 into "High state" (see FIG. 6(c)). Thereafter, the plate line PL1 is turned into "High state" in accordance with an output of the reference cell drive circuit 12 through the line GCP (see FIG. 6(d)).

The read-out voltage Vp is applied to both ends of the memory ferroelectric capacitor C11 and the load capacitor Cb both of which being connected in series electrically by turning the plate line PL1 into "High state". In this way, polarization state of the memory ferroelectric capacitor C11 tends to vary from a polarization state P1 to a polarization state P8.

On the contrary, the sense amplifier drive circuit 13 detects a rise of a signal being transferred on the line GCP, and the circuit 13 drives the sense amplifier AMP1 immediately after detecting "High state" of the line in accordance with an output of the reference cell drive circuit 12 in a certain period of time (see FIG. 6(f)). The duration is equivalent to the applying duration "tp" of read-out voltage Vp (2.5n seconds in above embodiment).

Polarization state P4 shown in FIG. 1 illustrates polarization state of the memory ferroelectric capacitor C11 when the sense amplifier AMP1 is driven. A divided voltage V1 is generated at the memory ferroelectric capacitor C11 according to the pictorial solution method at the polarization state P4. So that, potential of the bit line/BL1 evaluated by using the ground as the reference value becomes to a value shown in FIG. 6(e).

A reference voltage Vref (threshold voltage) is provided by the ferroelectric memory device 10 as a part of the reference cell preset circuit part 16 (see FIG. 2) through the bit line B11. The sense amplifier AMP1 compares the reference voltage Vref shown in FIG. 1 and the divided voltage V1 of the memory ferroelectric capacitor C11 (in an actual device, both the potential between the reference voltage Vref and that of divided voltage V1 are compared when the read-out voltage Vp shown in FIG. 1 is used as the reference). Potential of the bit line/BL1 is turned to "High state" as a result of judgement that stored data is "high" when the divided voltage V1 is higher than that of the reference voltage Vref (see FIG. 6(g)). At that time, polarization state of the memory ferroelectric capacitor C11 is turned to a polarization state P5 as shown in FIG. 1.

Thus, the variation of the memory ferroelectric capacitor C11 being varied from the polarization state P1 to the polarization state P8 is suspended at the polarization state P4 by decreasing the applying duration "tp" of read-out voltage Vp (tp=2.5n seconds in above embodiment). In this way, both the time and electric power consumption consumed during the polarization state P4 to the polarization state P8 can be decreased.

Value of the reference voltage Vref is set so as to be a value intermediate between the divided voltage V1 and another divided voltage V2.

Next, the plate line PL1 is turned to "Low state" in accordance with an output of the reference cell drive circuit 12 (see FIG. 6(h)).

Potential difference is generated between the plate line PL1 and the bit line/BL1 maintained under "High state" by turning the plate line PL1 into "Low state". The potential difference is equivalent to a first rewriting voltage Vrw1 shown in FIG. 1, and the potential difference is applied to the both ends of the memory ferroelectric capacitor C11. The memory ferroelectric capacitor C11 turns into the polarization state P6 shown in FIG. 1 as a result of application of the first rewriting voltage Vrw1. The polarization state P6 should be referred to as "full charged state".

Both the time and electric power consumption required for rewrite operation (the operation from the polarization state P5 to the polarization state P6) can be decreased by suspending the polarization state of the memory ferroelectric capacitor C11 in comparison with leaving a variation of the polarization state to the polarization state P8.

Next, the word line WL1 is turned to "Low state" when the memory ferroelectric capacitor C11 is in the "full charged state" by applying the first rewriting voltage Vrw1 (see FIG. 6(i)). Thus, the memory ferroelectric capacitor C11 is turned into "floating state" as a result of turning off both the selecting transistor TR11 and the transistor 15.

Then, potential "High" of the bit line/BL1 (see FIG. 6(k)) is incorporated into an output buffer 24 by turning an output line B1 of the columnar decoder 22 (see FIG. 6(j)) to "High" state. Thereafter, the bit line/BL1 is turned into "floating state" (see FIG. 6(n)) again as a result of turning off the sense amplifier AMP1 (see FIG. 6(m)) to "low" state. Finally, the read-out operation is completed by turning the output line B1 of the columnar decoder 22 to "Low" state.

On complete of the read-out operation, polarization state of the memory ferroelectric capacitor C11 comes back to the polarization state P1 shown in FIG. 1 with elapse of time.

Figure 7:
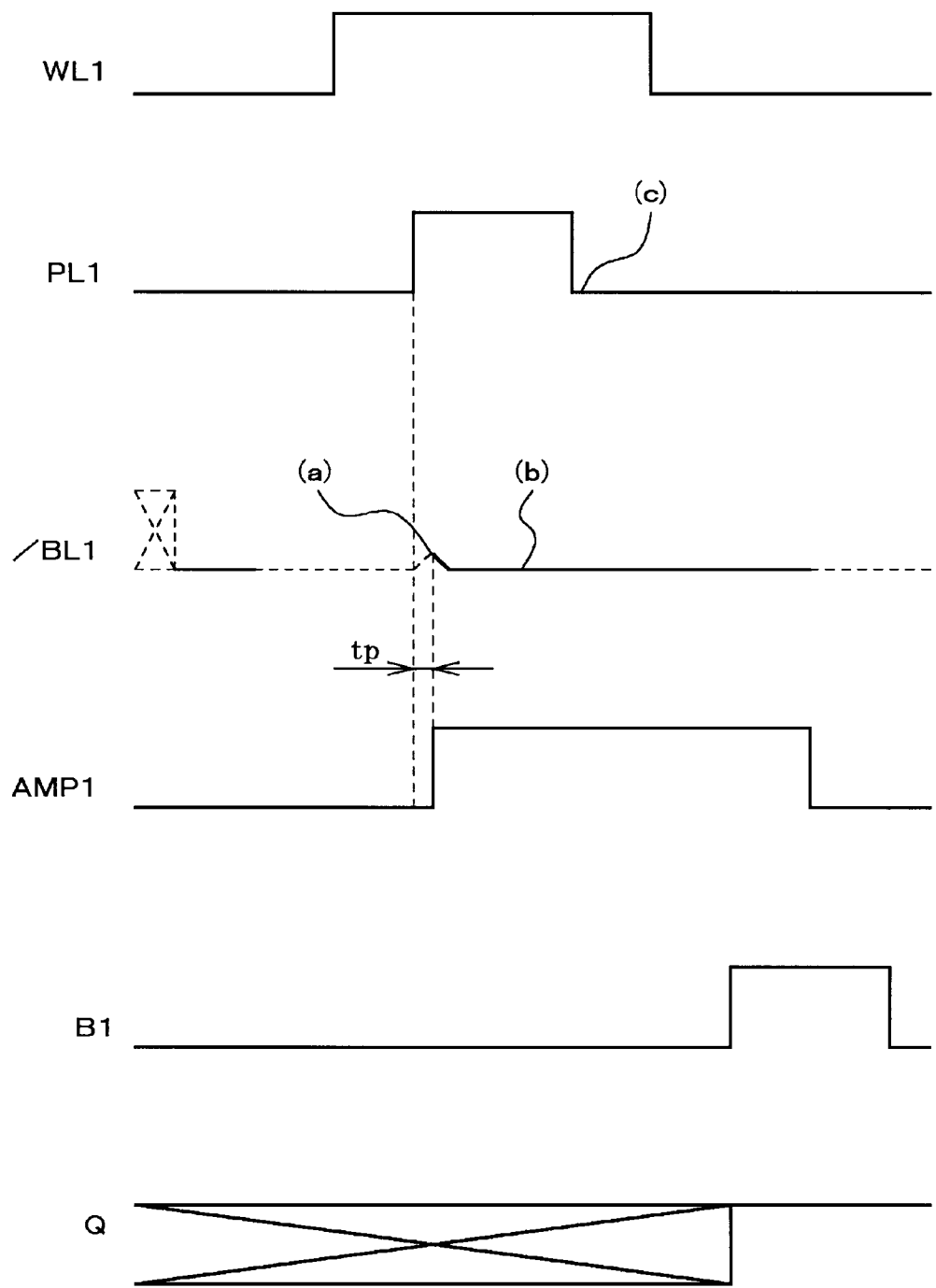
FIG. 7 is a timing chart for describing read-out procedure of data "Low" in the ferroelectric memory device 10.
Figure 8:
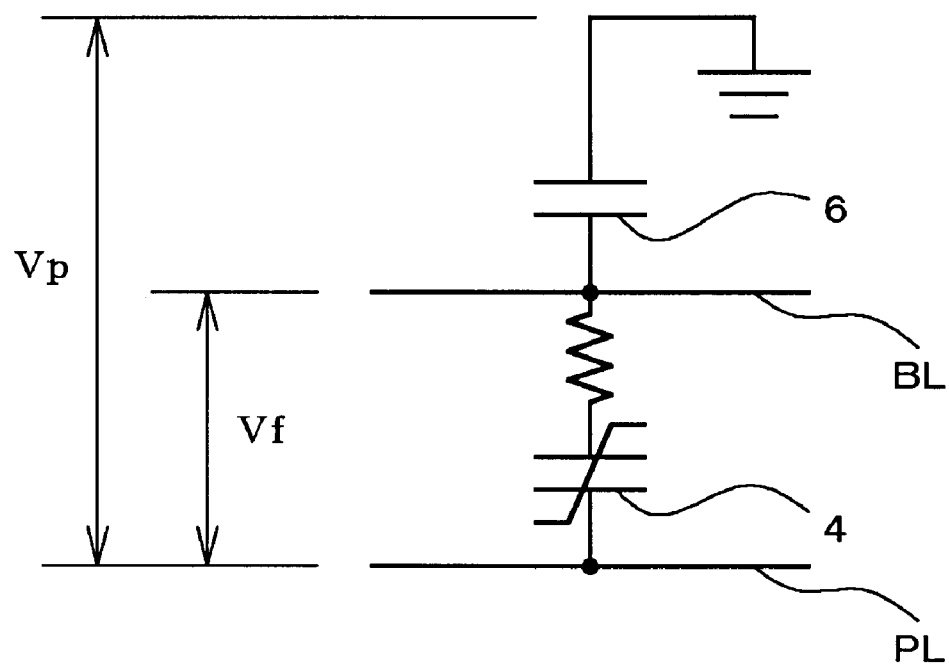
FIG. 8 is a circuit diagram of a part of the ferroelectric memory in a conventional ferroelectric memory device.
Figure 9:
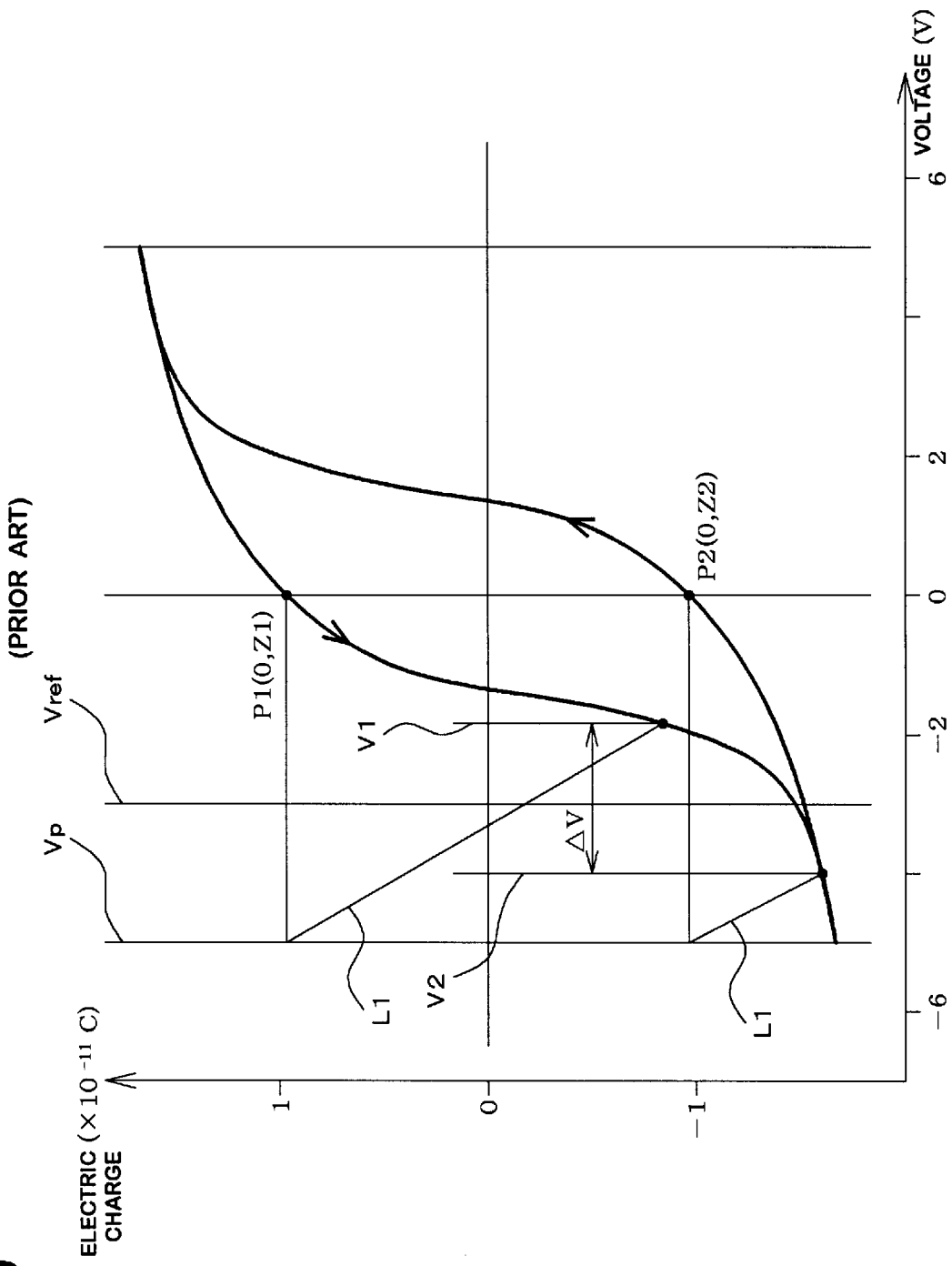
FIG. 9 is a graph for describing operation of a memory ferroelectric capacitor used for a conventional ferroelectric memory device.
Figure 10:
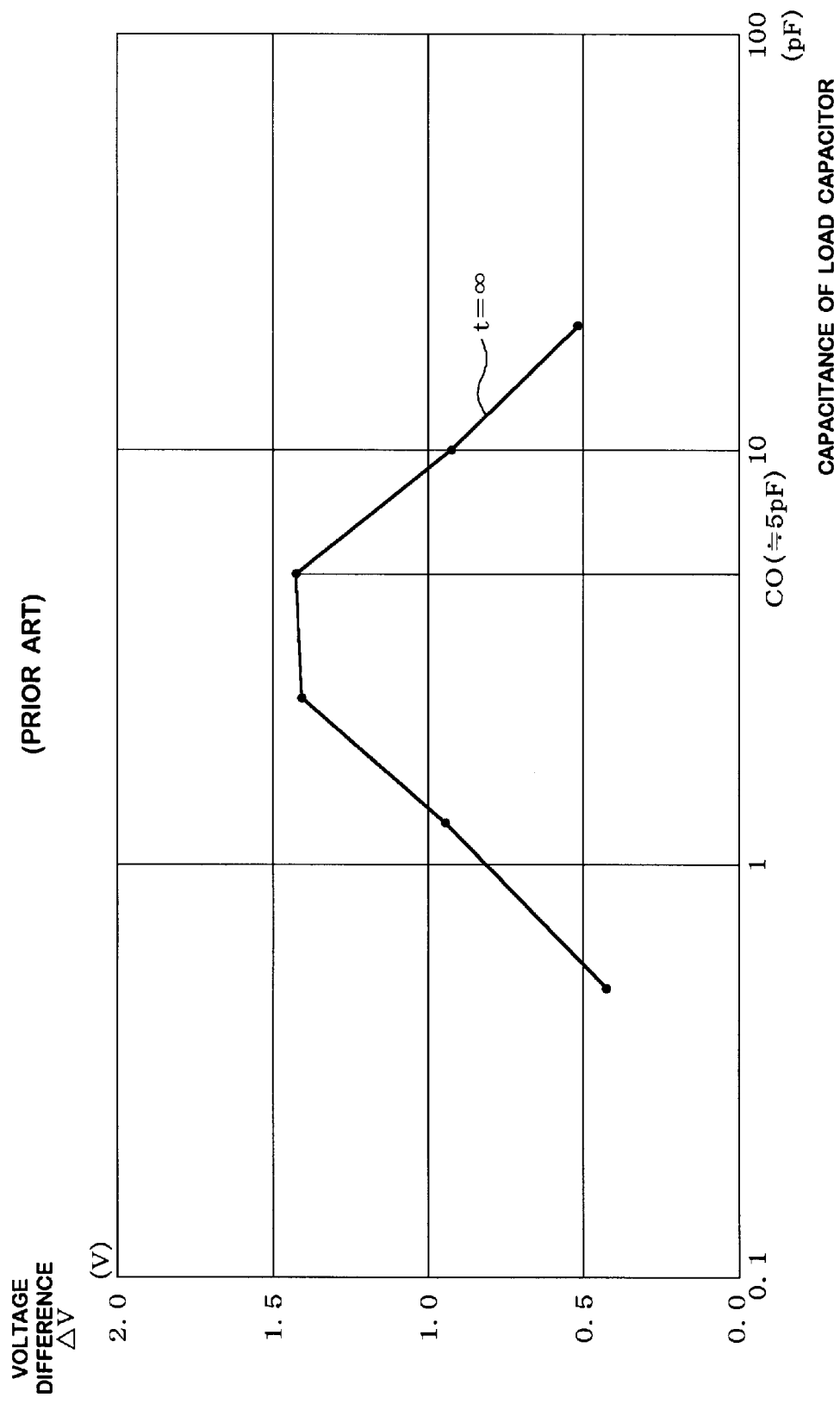
FIG. 10 is a graph for determining a capacitance of a load capacitor used for a conventional ferroelectric memory device.

Then, another read-out operation of stored data "Low" in the ferroelectric memory device 10 is described. FIG. 7 is a timing chart illustrating states of each lines when data "Low" stored in the ferroelectric memory device 10 is read out.

As shown in FIG. 6 and FIG. 7, the ferroelectric memory device 10 in this embodiment carries out the read-out operation under the same operation procedures no matter what the state of stored data without distinguishing "High" or "Low".

Therefore, the read-out operation of stored data "Low" is done under the same procedure as that of stored data "High". Only the difference between both of the read-out operation is starting point of read-out operation of stored data "Low" being located at the second polarization state P2 as shown in FIG. 1. During the read-out operation, polarization state of the memory ferroelectric capacitor C11 is turned to a polarization state P3 when the read-out voltage Vp shown in FIG. 1 is applied for the duration "tp". As a result, the divided voltage Vf generated at the memory ferroelectric capacitor C11 becomes the voltage V2. Potential of the bit line/BL1 evaluated at that time using the ground as the reference value becomes to a value shown in FIG. 7(a).

In this embodiment, the variation of the memory ferroelectric capacitor C11 being varied from the polarization state P2 to the polarization state P9 is suspended at the polarization state P3 by decreasing the applying duration "tp" of read-out voltage Vp (2.5n seconds in above embodiment) just as the read-out operation of the stored data "High". In this way, both the time and electric power consumption consumed during the polarization state P3 to the polarization state P9 can be decreased.

As described in above, potential of the bit line/BL1 is turned to "Low state" as a result of judgement that stored data is "Low", because the reference voltage Vref is set at a higher than the voltage V2 (see FIG. 7(b)).

Potential difference is generated between the plate line PL1 maintained under "High state" and the bit line/BL1 by turning potential of the bit line/BL1 into "Low state". The potential difference is equivalent to second rewriting voltage Vrw2 shown in FIG. 1 (equivalent to the read-out voltage Vp), and the potential difference is applied to the both ends of the memory ferroelectric capacitor C11. The memory ferroelectric capacitor C11 turns into the polarization state P7 shown in FIG. 1 as a result of application of the second rewriting voltage Vrw2.

Thereafter, the voltage applied to the both ends of the memory ferroelectric capacitor C11 is made to 0V compulsory by turning potential of the plate line PL1 into "Low state" (FIG. 7(c)). In this way, polarization state of the memory ferroelectric capacitor C11 comes back to the polarization state P2 shown in FIG. 1. Thus, stored data in the ferroelectric memory device 10 can be read out.

Although, the applying duration "tp" of read-out voltage Vp is set at the same duration as the applying duration "t" of the voltage Vd for determining characteristics of a capacitor in above embodiment, both of the duration can be different value. For instance, larger margin can be obtained at the read-out operation by setting the applying duration "tp" of read-out voltage Vp in longer than the applying duration "t" of the voltage Vd for determining characteristics of a capacitor.

Further, in the embodiment in above, the applying duration "t" which makes the maximum value of the voltage difference almost equal to a voltage corresponding the minimum detectable value of the sense amplifier AMP1 is selected and the capacitance which maximize the differential voltage ΔV is set as the capacitance of the load capacitor Cb when the applying duration "t" thus selected is used. Larger margin can be obtained at the read-out operation by setting the capacitance of the load capacitor Cb as a capacitance which maximize the differential voltage ΔV when an applying duration "t" of the voltage for determining characteristics of a capacitor Vd is used. The applying duration "t" is selected so as to make a voltage value relatively larger than a voltage corresponding the minimum detectable value of the sense amplifier AMP1 to the maximum value of the voltage difference ΔV.

Also, the capacitance of the load capacitor Cb can be varied at a value corresponding the applying duration "tp" of read-out voltage Vp required at the design work. For instance, the capacitance of the load capacitor Cb can be decreased when the applying duration "tp" of read-out voltage Vp thus required is short and the capacitance of the load capacitor Cb can be increased when the applying duration "tp" of read-out voltage Vp thus required is relatively long. In that case, larger margin can be obtained at the read-pout operation by setting the capacitance of the load capacitor Cb so as to maximize the differential voltage ΔV when the applying duration "tp" is used.

Further, though a parasitic capacitance of the bit line/BL1 is used as the load capacitor Cb in the embodiment described in above, an actual capacitor(s) can be provided as the load capacitor Cb. Also, a ferroelectric capacitor can be the load capacitor Cb other than the permanent dielectric capacitor. For instance, both the memory ferroelectric capacitor and the load capacitor Cb can be formed in the ferroelectric memory device 10 at the same step when a ferroelectric capacitor is used as the load capacitor Cb. As a result, characteristics of both the memory ferroelectric capacitor and the load capacitor Cb can be kept within a certain range even when manufacturing conditions of those capacitors are varied widely. Hysteresis curve of the ferroelectric capacitor corresponds to the voltage/charge characteristics of the load capacitor when a ferroelectric capacitor is used as the load capacitor Cb.

Although, voltage/charge characteristics of the memory ferroelectric capacitor is fixed before fixing voltage/charge characteristics of the load capacitor in the embodiment described above, the present invention does not limit that order. Voltage/charge characteristics of the load capacitor can be fixed before fixing that of the memory ferroelectric capacitor conversely to the above described embodiment. Also, voltage/charge characteristics of both the memory capacitor and the load capacitor can be fixed simultaneously.

Further, procedures carried out during the read-out operation do not have to follow the timing charts shown in FIG. 6 and FIG. 7. The application of the present invention is not limited to the ferroelectric memory device 10 having a circuit structure shown in FIG. 2.

The present invention is characterized in that, voltage/charge characteristics of the load capacitor is set so as to maximize a voltage difference between a divided voltage at the first polarization state and a divided voltage at the second polarization state when a voltage for determining characteristics of a capacitor equivalent to the read-out voltage is applied for a predetermined definite time period to the memory ferroelectric capacitor and the load capacitor both which are connected in series.

So that, voltage/charge characteristics of the load capacitor which maximize the voltage difference can be set under practical condition in comparison with a conventional ferroelectric memory device which is set voltage/charge characteristics of the load capacitor so as to maximize the voltage difference when the read-out voltage is applied for infinitive time to the plate line. In this way, a load capacitor which maximize the voltage difference in actual read-out operation can be realized. Further, a load capacitor capable of carrying out a high-speed read-out can be set.

In other words, it is possible to realize a ferroelectric memory device which comprises a load capacitor correspondingly appropriately to an actual read-out time period and capable of reading out stored data in a high-speed as well as saving electric power consumption.

Also, the present invention is characterized in that, the predetermined definite time period is set so as to make a maximum value of the voltage difference of the divided voltages and a voltage corresponding a minimum detectable value of the storing data detection means substantially be equivalent with each other. So that, read-out time period can be shorten to the minimum detectable value of the storing data detection means. In other words, the read-out operation can be done in a shorter period of time. Further, as a result, electric power consumption is decreased.

Further, the present invention is characterized in that, the read-out voltage is applied for a duration substantially equivalent to the predetermined definite time period, and detection of the storing data is carried out by the storing data detection means immediately after elapse of the duration of read-out voltage application. So that, a series of operations such as application of the read-out voltage, detection of the stored data and rewriting of stored data can be done in a shorter period of time. Therefore, electric power consumption is further decreased.

The present invention is characterized in that, voltage/charge characteristics of the load capacitor is set in correspondence to an duration of applying the read-out voltage. So that, a desired load capacitor corresponding an actual read-out time period can be realized.

Also, the present invention is characterized in that, voltage/charge characteristics of the load capacitor is set so as to maximize a voltage difference between a divided voltage at the first polarization state and a divided voltage at the second polarization state during an applying duration of the read-out voltage. In this way, a load capacitor capable of maximizing margin of detection during an actual applying duration of the read-out voltage can be realized. Therefore, an appropriate load capacitor correspond to an actual read-out time period is obtained.

While the invention has been described in its preferred embodiments, it is to be understood that the words which have been used and words of description rather than limitation and that changes within the purview of the appended claims may be made without departing from the true scope and spirit of the invention in its broader aspects.

What is claimed is:

1. A ferroelectric memory device comprising:
   a memory ferroelectric capacitor capable of storing a first polarization state corresponding to a first storing data or a second polarization state corresponding to a second storing data, a load capacitor capable of being connected to the memory ferroelectric capacitor in series, and a storing data detection means for detecting the storing data in accordance with a divided voltage generated at the memory ferroelectric capacitor when a predetermined read-out voltage is applied to both the memory ferroelectric capacitor and the load capacitor both of which are connected to each other in series, wherein a capacitance value of the load capacitor is set so as to maximize a voltage difference between the divided voltage at the first polarization state and the divided voltage at the second polarization state when a voltage for determining characteristics of a capacitor equivalent to the read-out voltage is applied for a predetermined definite time period to the memory ferroelectric capacitor and the load capacitor both of which are connected in series within a time period of a transient-state of the divided voltage in order to detect the storing data in accordance with the divided voltage in the transient-state.

2. A ferroelectric memory device in accordance with claim 1, wherein the predetermined definite time period is set so as to make a maximum value of the voltage difference of the divided voltages and a voltage corresponding a minimum detectable value of the storing data detection means substantially equivalent with each other.

3. A ferroelectric memory device in accordance with claim 2, wherein the voltage corresponding the minimum detectable value of the storing data detection means is determined in consideration of tolerance caused at manufacturing processes and margin of data detection.

4. A ferroelectric memory device in accordance with claim 2, wherein the read-out voltage is applied for a duration substantially equivalent to the predetermined definite time period, and detection of the storing data is carried out by the storing data detection means immediately after elapse of the duration of read-out voltage application.

5. A ferroelectric memory device in accordance with claim 1, wherein the load capacitor is a permanent dielectric capacitor, and a capacitance value of the load capacitor corresponds to a capacitance of the permanent dielectric capacitor.

6. A ferroelectric memory device in accordance with claim 1, wherein the load capacitor is a ferroelectric capacitor, and a capacitance value of the load capacitor corresponds to a hysteresis of the ferroelectric capacitor.

7. A ferroelectric memory device in accordance with claim 1, wherein the ferroelectric memory device has a matrix structure composed of a plurality of memory cells, a desired memory cell is appointed by selecting a memory cell located on an intersection of a desired row belongs to a word line and a desired column belongs to a bit line, and wherein the memory cell comprises the memory ferroelectric capacitor and the load capacitor one end of which is connected to one end of the memory ferroelectric capacitor through a selecting transistor, and wherein a control input terminal of the selecting transistor is connected to the word line, and wherein connecting part of the selecting transistor and the load capacitor is connected to a bit line for detecting storing data, and wherein a ground potential is applied to the other end of the load capacitor, and wherein the other end of the memory ferroelectric capacitor is connected to a plate line for applying a read-out voltage.

8. A ferroelectric memory device in accordance with claim 7, wherein a reference cell drive circuit for providing the read-out voltage to the plate line is provided.

9. A ferroelectric memory device in accordance with claim 7, wherein the storing data detection means comprises both a sense amplifier part and a cell preset circuit part, and data stored in the cell is detected by comparing a voltage appeared on the bit line during read out of the data with a reference voltage generated at the cell preset circuit part by the sense amplifier part.

10. A ferroelectric memory device in accordance with claim 9, wherein the storing data detection means holds own operation for a predetermined duration after detecting application of a read-out voltage to the plate line, and wherein the storing data detection means drives the sense amplifier part immediately after holding the operation.

11. A ferroelectric memory device in accordance with claim 7, wherein the load capacitor is a parasitic capacitor between the bit line and the ground potential.

12. A ferroelectric memory device comprising:

a memory ferroelectric capacitor capable of storing a first polarization state corresponding to a first storing data or a second polarization state corresponding to a second storing data, a load capacitor capable of being connected to the memory ferroelectric capacitor in series, and a storing data detection means for detecting the storing data in accordance with a divided voltage generated at the memory ferroelectric capacitor when a predetermined read-out voltage is applied to both the memory ferroelectric capacitor and the load capacitor both of which are connected to each other in series, wherein a capacitance value of the load capacitor is set in correspondence to a duration of applying the read-out voltage in order to detect the storing data in accordance with the divided voltage in a transient-state.

13. A ferroelectric memory device in accordance with claim 12, wherein a capacitance value of the load capacitor is set so as to maximize a voltage difference between the divided voltage at the first polarization state and the divided voltage at the second polarization state in the duration of applying the read-out voltage.

14. A method for manufacturing a ferroelectric memory device comprising a memory ferroelectric capacitor capable of storing a first polarization state corresponding to a first storing data or a second polarization state corresponding to a second storing data, a load capacitor capable of being connected to the memory ferroelectric capacitor in series and a storing data detection means for detecting the storing data in accordance with a divided voltage generated at the memory ferroelectric capacitor when a predetermined read-out voltage is applied to both the memory ferroelectric capacitor and the load capacitor both of which are connected to each other in series comprising the step of:

setting a capacitance value of the load capacitor so as to maximize a voltage difference between the divided voltage at the first polarization state and the divided voltage at the second polarization state when a voltage for determining characteristics of a capacitor equivalent to the read-out voltage is applied for a predetermined definite time period to the memory ferroelectric capacitor and the load capacitor both of which are connected in series within a time period of a transient-state of the divided voltage in order to detect the storing data in accordance with the divided voltage in the transient-state.

15. A method for manufacturing a ferroelectric memory device in accordance with claim 14, wherein the predetermined definite time period is set so as to make a maximum value of the voltage difference of the divided voltages and a voltage corresponding a minimum detectable value of the storing data detection means substantially equivalent with each other.

16. A method for manufacturing a ferroelectric memory device in accordance with claim 15, wherein the voltage corresponding the minimum detectable value of the storing data detection means is determined in consideration of tolerance caused at manufacturing processes and margin of data detection.

17. A method for manufacturing a ferroelectric memory device in accordance with claim 15, further comprising steps of:

obtaining relationships between a capacitance value of the load capacitor and the voltage difference when a hysteresis of the memory ferroelectric capacitor is fixed to a certain value using a time period "t" of applying the voltage for determining characteristics of a capacitor as a parameter, selecting a time period "t" to make a maximum value of the voltage difference and the voltage corresponding the minimum detectable value of the storing data detection means substantially being equivalent with each other, and setting the capacitance value maximizing the voltage difference when the voltage for determining characteristics of a capacitor is applied for the time period "t" as the capacitance value of the load capacitance.

18. A method for manufacturing a ferroelectric memory device in accordance with claim 17, wherein an applying duration of the read out voltage is set so as to equivalent to the time period "t" thus selected.

19. A ferroelectric memory device comprising:

a memory ferroelectric capacitor capable of storing a first polarization state corresponding to first storing data or a second polarization state corresponding to second storing data;

means for maximizing a voltage difference between a first divided voltage at the first polarization state and a second divided voltage at the second polarization state when a voltage equivalent to a read-out voltage is applied for a predetermined definite period within a time period of a transient-state period, to said maximizing means and said memory ferroelectric capacitor connected in series; and storing data detection means for detecting the first and second storing data when the read-out voltage is applied to said maximizing means and said memory ferroelectric capacitor connected in series.

20. A method for manufacturing a ferroelectric memory device comprising a memory ferroelectric capacitor capable of storing a first polarization state corresponding to a first storing data or a second polarization state corresponding to a second storing data, means for maximizing a voltage difference between a first divided voltage at the first polarization state and a second divided voltage at the second polarization state when a voltage equivalent to a read-out voltage is applied for a predetermined definite period to said maximizing means and said memory ferroelectric capacitor connected in series and a storing data detection means for detecting the storing data in accordance with the first and second divided voltages generated at the memory ferroelectric capacitor when a predetermined read-out voltage is applied to both the memory ferroelectric capacitor and the maximizing means, both of which are connected to each other in series, comprising the step of:

setting a capacitance value of the maximizing means so as to maximize toe voltage difference between the first divided voltage at the first polarization state and the second divided voltage at the second polarization state when a voltage equivalent to the read-out voltage is applied for a predetermined definite time period within a time period of a transient-state to the memory ferroelectric capacitor and the maximizing means both of which are connected in series.

* * * * *